(12) United States Patent
Lim et al.

(10) Patent No.: US 9,117,858 B2
(45) Date of Patent: Aug. 25, 2015

(54) HEATER BLOCK AND HEAT TREATMENT APPARATUS HAVING THE SAME

(71) Applicant: AP SYSTEMS INC., Hwaseong-Si, Gyeonggi-Do (KR)

(72) Inventors: Il Hwan Lim, Seongnam-Si (KR); Jang Woo Shim, Hwaseong-Si (KR); Chul Soo Kim, Boryeong-Si (KR); Seung Ae Choi, Hwaseong-Si (KR)

(73) Assignee: AP SYSTEMS INC. (KR)

( * ) Notice: Subject to any disclaimer, the term of this patent is extended or adjusted under 35 U.S.C. 154(b) by 220 days.

(21) Appl. No.: 13/791,848

(22) Filed: Mar. 8, 2013

(65) Prior Publication Data

US 2013/0287376 A1    Oct. 31, 2013

(30) Foreign Application Priority Data

Mar. 9, 2012    (KR) .................. 10-2012-0024566

(51) Int. Cl.
| F26B 3/30 | (2006.01) |
| F26B 19/00 | (2006.01) |
| F24C 7/00 | (2006.01) |
| H01L 21/67 | (2006.01) |

(52) U.S. Cl.
CPC ................. *H01L 21/67115* (2013.01)

(58) Field of Classification Search
None
See application file for complete search history.

(56) References Cited

U.S. PATENT DOCUMENTS

| 3,455,622 | A | * | 7/1969 | Cooper ........................ 359/359 |
| 4,460,939 | A | * | 7/1984 | Murakami et al. ........... 362/609 |
| 5,745,234 | A | * | 4/1998 | Snail et al. .................... 356/236 |
| 5,860,723 | A | * | 1/1999 | Domas et al. ................ 362/346 |
| 6,227,682 | B1 | * | 5/2001 | Li ................................. 362/302 |
| 6,356,700 | B1 | * | 3/2002 | Strobl .......................... 385/147 |
| 7,232,241 | B2 | * | 6/2007 | Takezawa .................... 362/302 |
| 7,305,159 | B1 | * | 12/2007 | Cummings et al. ............ 385/31 |
| 7,938,643 | B2 | * | 5/2011 | Rueggeberg ................... 433/29 |
| 8,727,574 | B2 | * | 5/2014 | Simchak et al. .............. 362/299 |
| 2003/0222869 | A1 | * | 12/2003 | Yoshino ....................... 345/419 |
| 2012/0048322 | A1 | | 3/2012 | Ghoshal et al. |
| 2014/0246422 | A1 | * | 9/2014 | Koren et al. ................. 219/494 |

FOREIGN PATENT DOCUMENTS

| JP | 2012042931 A | 3/2012 |
| KR | 20080020047 A | 3/2008 |
| KR | 101092418 | 12/2011 |

* cited by examiner

*Primary Examiner* — Thor Campbell

(57) ABSTRACT

A heater block according to the present invention comprises a light-emitting lamp; a concave reflecting member that is placed opposite the lamp and has a concave reflecting surface at one surface faced with the lamp; a lens module that is inserted into the concave reflecting member and has at least one lens; and a flat reflecting member that is placed opposite the lens module. According to embodiments of the present invention, light emitted from the lamp is reflected by the concave reflecting member. Then, light and heat are collected from the reflected light by the flat reflecting member and the lens module and are irradiated on a substrate. That is, light having energy greater than a conventional manner is irradiated on the substrate to enhance the instant heating temperature and temperature increasing rate of substrate and to increase a heat-focusing area. Therefore, it has an advantage that the productivity of semiconductor or display device manufacture that requires a rapid thermal process is improved.

18 Claims, 6 Drawing Sheets

HEATER BLOCK AND HEAT TREATMENT APPARATUS HAVING THE SAME

TECHNICAL FIELD

The present invention relates to a heater block and a heat treatment apparatus having the same, and more particularly to a heater block that can enhance heating efficiency and a heat treatment apparatus having the same.

BACKGROUND

As a display device (FPD, LCD, OLED) or a semiconductor device is miniaturized and a pattern is micronized, a rapid thermal process (RTP) that can heat rapidly a local region of a substrate has been used.

An energy density ($J/cm^2$) required for a process of manufacturing a display or semiconductor device is about 1.5 $J/cm^2$, and an eximer laser can meet this requirement. Therefore, an eximer laser is used as a heat source in a rapid thermal apparatus. Since an energy density of a single eximer laser is about 1.05 $J/cm^2$, double eximer lasers are used to amplify the energy density to about 2.1 $J/cm^2$. However, such an eximer laser has a disadvantage in that it is expensive, requires a large area, and comprises a complicate optical route.

A lamp that is relatively cheaper than an eximer laser, for example a tungsten halogen lamp is used as a heat source. However, energy of a tungsten halogen lamp is 1/6.5 lesser than energy of an eximer laser. Therefore, there is a problem that energy required for a rapid thermal process is not sufficiently provided. To solve this problem, a number of tungsten halogen lamps may be used, but problems such as an increase in power consumption and a large area for an apparatus are caused.

As a related technique, KR Patent Publication No. 2003-0055130 discloses a rapid thermal apparatus comprising a chamber, a wafer edge ring provided to situate a wafer inside the chamber, a lamp housing coupled at an upper portion of the chamber opposite the wafer, a plurality of lamps coupled at a lower portion of the lamp housing to heat the wafer, and a rotating unit coupled to the lamp housing to rotate the lamps as the wafer is heated.

PRIOR ART DOCUMENT

Patent Document (Patent Document 1) KR Patent Publication No. 2003-0055130

SUMMARY

Problems to be Solved

It is an object of the present invention to provide a heater block that can enhance heating efficiency and a heat treatment apparatus having the same.

It is another object of the present invention to provide a heater block that can enhance light and heat collecting efficiency and a heat treatment apparatus having the same.

Means to Solve the Problems

According to the present invention, a heater block comprises a light-emitting lamp; a concave reflecting member that is placed opposite the lamp and has a concave reflecting surface at one surface faced with the lamp; a lens module that is inserted into the concave reflecting member and has at least one lens; and a flat reflecting member that is placed opposite the lens module.

Preferably, the lamp is provided as a plurality of lamps.

Preferably, the lamp is at least one of a tungsten halogen lamp and an arc lamp.

Preferably, the lamp is any one of a bulb type lamp and a liner type lamp.

The heater block further comprises a housing that is placed opposite the reflecting surface of the concave reflecting member and is coupled to the concave reflecting member at its one end. The lamp and the flat reflecting member are inserted and fixed inside the housing.

One surface of the light-emitting lamp and one surface of the flat reflecting member are exposed outside the housing and are fixed faced with the reflecting surface of the concave reflecting member.

Preferably, the reflecting surface of the concave reflecting member is inclined downwardly from both edges toward a direction that the lens module is placed.

Preferably, at least the reflection surface of the concave reflecting member is made from at least one of aluminum (Al), silver (Ag), nickel (Ni) and gold (Au).

The lamp is placed at both sides around the flat reflecting member.

Preferably, the flat reflecting member is made from at least one of gold (Au), aluminum (Al), silver (Ag) and nickel (Ni).

The lens module comprises a plurality of lenses and the plurality of lenses is disposed in a vertical direction.

Preferably, the lens is at least one of a spherical lens, an aspherical lens, a microlens and concave lens.

An auxiliary lens is fixed between the lamp and the concave reflecting member, and the auxiliary lens is a spherical lens that is concave upwardly and downwardly.

The heater block further comprises an auxiliary lamp that is fixed such that its one end is inserted into one side of the concave reflecting member and the other end is protruded beyond the other side of the concave reflecting member, to heat a peripheral temperature around an object to be heat-treated.

The heater block further comprises a window that covers the auxiliary lamp.

According to the present invention, a heat treatment apparatus comprises a chamber having an inner space; a susceptor that is fixed inside the chamber to support a substrate; and a heater block that is placed opposite the susceptor to heat the substrate, wherein the heater block comprises a light-emitting lamp; a concave reflecting member that is placed opposite the lamp and has a concave reflecting surface at one surface faced with the lamp; a lens module that is inserted into the concave reflecting member and has at least one lens; and a flat reflecting member that is placed opposite the lens module.

According to claim 16, the heater block is placed at an outside of the chamber or at an inside of the chamber.

The reflecting surface of the concave reflecting member is inclined downwardly from edges toward a direction that the lens module is placed.

The lens module comprises a plurality of lenses, the plurality of lenses is disposed in a vertical direction, and the lenses are at least one of a spherical lens, an aspherical lens, a microlens and concave lens.

Effect of the Invention

A heater block according to an embodiment of the present invention comprises a light-emitting lamp; a concave reflecting member that is placed at one side of the lamp and has a concave reflecting surface at one surface faced with the lamp; a lens module that is inserted into the concave reflecting member and has at least one lens; and a flat reflecting member that is placed opposite the lens module at one side of the concave reflecting member. Therefore, light emitted from the lamp is reflected by the reflecting surface of the concave reflecting member, and light and heat are collected by the flat reflecting member and the lens module and are irradiated on a substrate. As a result, light having energy greater than a conventional manner is irradiated on the substrate to enhance the instant heating temperature and temperature increasing rate of substrate and to increase a heat-focusing area. Consequently, it has an advantage that the productivity of semiconductor or display device manufacture that requires a rapid thermal process is improved.

Furthermore, a heater block according to an embodiment of the present invention can replace an expensive laser generator that requires a complicate optical route. Therefore, a heat treatment apparatus can be manufactured with reduced cost, simplified assembly and reduced installation area.

DETAILED DESCRIPTION

Now, embodiments according to the present invention will be described in detail. However, the present invention is not limited to these embodiments, but may be practiced as various different configurations. These embodiments are provided to give a full understanding of the present invention. The present invention will be fully understood by a person skilled in the art from these embodiments.

Figure 1:
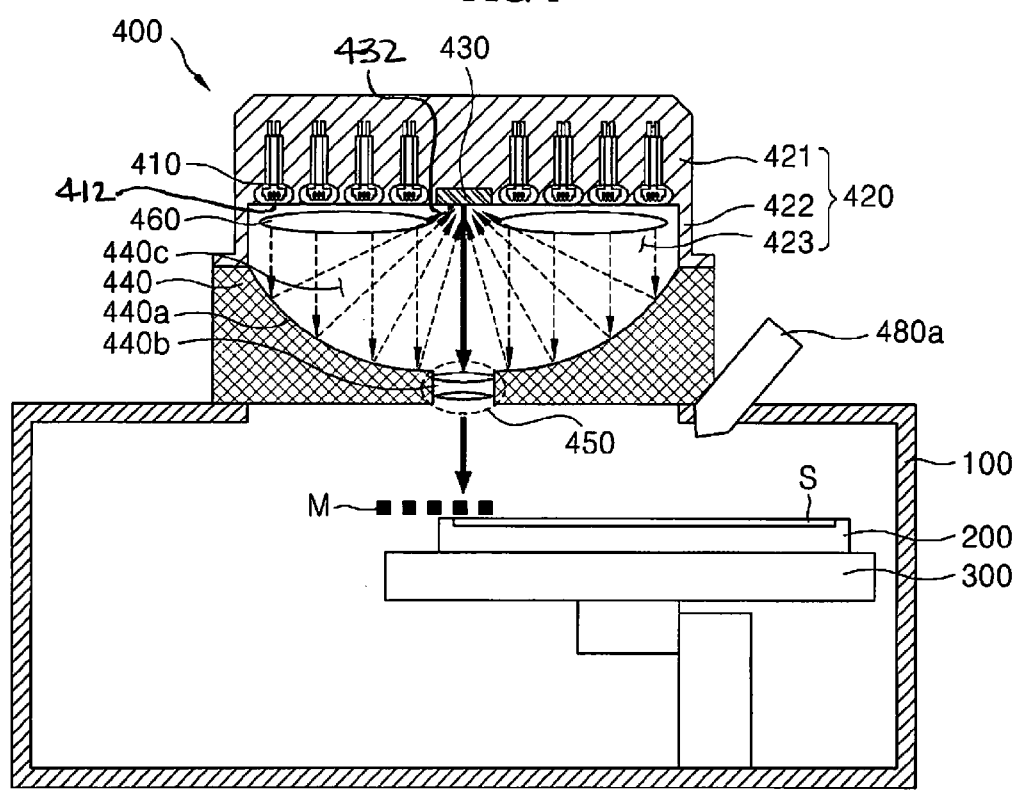
FIG. 1 is a cross-sectional view showing a heat treatment apparatus according to an embodiment of the present invention.
Figure 2:
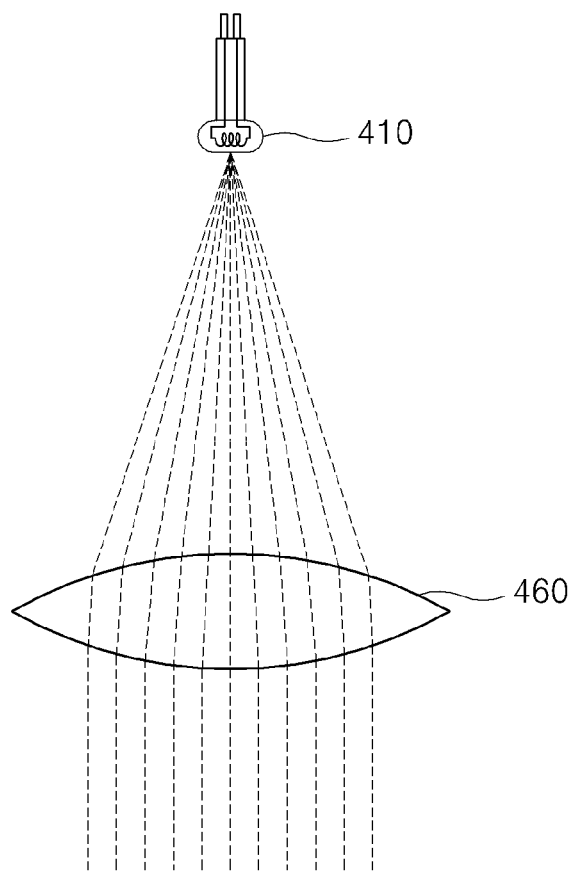
FIG. 2 is a diagram illustrating a change in light direction due to an auxiliary lens according to an embodiment of the present invention.

FIG. 1 is a cross-sectional view showing a heat treatment apparatus according to an embodiment of the present invention. FIG. 2 is a diagram illustrating a change in light direction due to an auxiliary lens according to an embodiment of the present invention.

A heat treatment apparatus according to an embodiment of the present invention is an apparatus used in a rapid thermal process (RTP) that heats rapidly an object to be heat-treated, for example a substrate. As shown in FIG. 1, the heat treatment apparatus comprises a chamber 100; a susceptor 200 that is fixed inside the chamber 100 and has a substrate S situated thereon; a stage 300 that is fixed to support the susceptor 200 and to move the susceptor 200 having the substrate S situated thereon in horizontal and vertical directions; and a heater block 400 that is placed opposite the susceptor 200 and the stage 300 at an outside of the chamber 100 and provides a heat source to heat the substrate S. The heat treatment apparatus also comprises a mask M disposed between the heater block 400 and the substrate S inside the chamber 100 and a temperature detector 480a fixed such that its one end is inserted inside the chamber 100 to detect an inner temperature of the chamber 100. In addition, the heat treatment apparatus may further comprise a gas supply unit (not shown) to supply gas to an inside of the chamber 100.

The mask M has a single aperture or a plurality of apertures that is spaced apart from each other and adjusts an exposed area of the substrate. That is, light emitted from the heater block 400 is irradiated on the substrate S through the aperture of the mask M. An aperture pattern of the mask M may be variously varied depending on a purpose of process and a shape of device to be manufactured.

The temperature detector 480a is placed at an upper portion of the chamber 100 and measures temperature in a non-contact manner. A pyrometer is herein used. However, the temperature detector is not limited to the pyrometer, but various means to detect temperature in a non-contact manner may be used.

The chamber 100 is made as a quadrangle box shape having an empty inner space in which the substrate S may be heat-treated. A shape of the chamber 100 is not limited to the quadrangle box shape, but various shapes having an inner space in which the substrate S may be treated may be made. The heater block 400 is placed at an outside of the chamber 100, and a bottom portion of the heater block 400 is coupled to a top portion of the chamber 100. One side of the chamber 100 at which the heater block 400 is placed is opened, and a lens module 450 of the heater block 400 is exposed inside the chamber. A sealing member (not shown) may be fixed around a coupling surface of the chamber 100 and the heater block 400 to maintain vacuum inside the chamber 100. Also, a vacuum processor for inducing vacuum inside the chamber 100 and an exhaust portion for exhausting an inside of the chamber 100 may be fixed in the chamber 100. An entry port for the substrate S is also provided.

The susceptor 200 is mounted on the stage 300 inside the chamber 100, and the substrate S is situated on the susceptor 200. The susceptor 200 may be a means to support and hold the substrate S by vacuum aspiration power, or an electrostatic chuck to support and hold the substrate S by electrostatic power. However, the susceptor 200 is not limited to them, but various means to support and hold the substrate S, for example a means using a clamp may be used. Also, a heater (not shown) for heating the substrate S and a cooling means (not shown) for cooling the heated substrate S or the susceptor 200 may be fixed.

The stage 300 moves the susceptor 200 horizontally in x or y direction, or vertically in z direction. Since the stage 300 is similar to a common device for moving the susceptor 200 in horizontal and vertical directions, it will be not described in detail.

The heater block 400 is placed opposite the susceptor 200 at an outside of the chamber 100, and irradiates light toward the substrate S to heat rapidly the substrate S. The heater block 400 comprises a housing 420; a plurality of lamps 410 that are inserted and fixed into housing 420; a concave reflecting member 440 that is placed opposite the plurality of lamps 410 and has a concave shape at a surface faced with the plurality of lamps 410; an auxiliary lens 460 that is disposed between the lamps 410 and the concave reflecting member 440; a flat reflecting member 430 that is inserted and fixed into the housing 420 opposite the concave reflecting member 440; and a lens module 450 that is inserted and fixed into the concave reflecting member 440 and has a lens opposite the flat reflecting member 430.

The housing is placed at an upper portion of the concave reflecting member 440 and is connected to the concave reflecting member 440 at its one end. The plurality of lamps 410 and the flat reflecting member 430 are inserted and fixed into the housing. According to an embodiment, the housing is made from stainless steel (STS). However, a material for housing is not limited to this, but various metallic materials may be used. For example, the housing 420 may comprise a fixing member 421 having receiving recesses into which the plurality of lamps 410 and the flat reflecting member 430 are individually inserted, and a protruding member 422 that extends from a lower edge of the fixing member 421 toward a direction that the concave reflecting member 440 is placed. According to an embodiment, the fixing member 421 is made as having a quadrangular cross-section shape. However, the fixing member is not limited to this shape, but it may be made as various shapes, for example a circular or polygonal cross-section shape depending on a fixing position and an arrangement of the plurality of lamps 410 and the flat reflecting member 430. The protruding member 422 is fixed to protrude from a bottom surface of the fixing member 421 toward a direction that the concave reflecting member 440 is placed. As a result, a space is formed from the bottom surface of the fixing member 421 and the protruding member 422, and hereinafter the space is designated as a first space 423. The first space 423 of the housing is communicated with an inner space (a second space 440c) of the concave reflecting member 440 as described below. Also, a lower end of the protruding member 422 is coupled to an upper edge region of the concave reflecting member 440. A separate coupling member (not shown) may be connected between the protruding member 422 and the concave reflecting member 440.

A cooling means (not shown) may also be fixed inside the housing 420 to cool down the housing 420.

The lamp 410 is inserted and fixed into the housing 420 with one surface 412 from which light is emitted being exposed toward the housing 420, in particular the concave reflecting member 440. A plurality of lamps 410 is herein provided, and the plurality of lamps 410 is preferably fixed side by side in one direction. Alternatively, the plurality of lamps 410 may be disposed in right and left directions around a center portion in wide of the housing 420. That is, a plurality of lamps 410 is fixed in the left side of the center portion in wide of the housing 420, and a plurality of lamps 410 is fixed in the right side thereof. No lamp 410 is fixed at the center portion of the housing 420, and the flat reflecting member 430 is fixed at the center portion as described below. A fixing position and an arrangement of the plurality of lamps 410 may be variously varied. According to an embodiment, as the lamp 410, any one of a tungsten halogen lamp emitting infrared radiation and an arc lamp may be used. Also, the lamp 410 may be any one of a bulb type lamp and a liner type lamp.

It hitherto has been described that a plurality of lamps 410 is provided. However, the number of lamps is not particularly limited, but a single lamp 410 may be provided.

The auxiliary lens 460 is placed between the lamps 410 and concave reflecting member 440 to alter an advancing direction of lights emitted from the lamps 410. In other words, as shown in FIG. 2, lights emitted from the lamps 410 are initially advanced in a diagonal direction not a straight downward direction, and gradually recede from the lamp 410. To advance such lights in a straight downward direction not a diagonal direction, the auxiliary lens 460 is fixed between the lamps 410 and the concave reflecting member 440. The auxiliary lamp 410 is a spherical lens. In particular, as the auxiliary lens 460, an oval-shaped spherical lens that is concave upwardly and downwardly is preferably used. As a result, lights emitted from the lamps 410 advance in a diagonal direction and enter the auxiliary lens 460. Then, these lights pass through the auxiliary lens 460 and advance to the concave reflecting member 440 in a straight downward direction. Consequently, loss of lights emitted from the lamps 410 can be reduced, and light and heat collecting efficiency can be enhanced.

The flat reflecting member 430 is inserted and fixed into housing 420, in particular a lower portion of the fixing member 421 of the housing 420 with its bottom surface 432 being exposed toward the concave reflecting member 440. The flat reflecting member 430 is preferably fixed at a lower portion of the center portion of the housing 420 at which no lamp 410 is fixed with its bottom surface being exposed. According to an embodiment, as the flat reflecting member 430, a quadrangular flat plate coated with gold (Au) is used. Since gold (Au) has reflectivity greater than about 95%, it can reflect light to the lens module 450 with minimum loss. Also, due to high reflectivity, an increase in temperature of the flat reflecting member 430 by light can be suppressed. However, the flat reflecting member 430 is not limited to this, but silver (Ag), aluminum (Al) or nickel (Ni) which has good reflectivity may be coated on the flat reflecting member. Alternatively, a flat bulk plate comprised of gold (Au), silver (Ag), aluminum (Al) or nickel (Ni) may be used as the flat reflecting member 430. Lights emitted from the plurality of lamps 410 are reflected by the concave reflecting member 440 and reach the flat reflecting member 430. Then, these lights are reflected by the flat reflecting member 430 and enter the lens module 450 fixed in the concave reflecting member 440.

The concave reflecting member 440 that is placed opposite the plurality of lamps 410 collects lights emitted from the plurality of lamps 410, and the collected lights enter the flat reflecting member 430. One surface of the concave reflecting member 440 faced with the lamps 410 and the flat lamps 410 has a concave shape in a direction that the chamber 100 is placed. That is, one surface of the concave reflecting member 440 has a concave shape inclined downwardly from both edges toward a direction that the lens module 450 is placed. In addition, since the lens module 450 is placed at a center portion of the concave reflecting member 440, one surface of the concave reflecting member 440 is also preferably inclined downwardly from both edges toward the center portion. Hereinafter, for convenience, one surface of the concave reflecting member 440 faced with the lamps 410 and the flat reflecting member 430 is designated as 'a reflecting surface' 440a. As described above, since one surface of the concave reflecting member 440 faced with the lamps 410 and the flat reflecting member 430 has a concave shape, a desired space, i.e. a concave recess (hereinafter, second space 440c) is formed at an upper portion of the reflecting surface 440a. The second space 440c of the concave reflecting member 440 is communicated with the first space 423 of the housing 420. The first and second spaces 423 and 440c serve as spaces through which lights emitted from the plurality of lamps 410 are transferred from concave reflecting member 440 through the flat reflecting member 430 to the lens module 450.

Also, the concave reflecting member 440 has an opening 440b of which upper and lower portions are opened to insert the lens module 450. The opening 440b is provided opposite the flat reflecting member 430, and preferably is placed directly below the flat reflecting member 430. As a result, the lens module 450 is inserted and fixed into the opening 440b provided in the concave reflecting member 440 opposite the flat reflecting member 430, preferably directly below the flat reflecting member 430. Consequently, lights reflected from the flat reflecting member 430 enter the lens module 450.

While lights passing through the auxiliary lens 460 enter the reflecting surface 440a of the concave reflecting member 440, some of these lights are reflected from the reflecting surface 440a. Lights passing through the auxiliary lens 460 advance directly in a downward direction, i.e. a straight downward direction and enter over the reflecting surface 440a. Lights reflected from the reflecting surface 440a are collected toward the flat reflecting member 430, because an advancing direction of lights is altered toward the flat reflecting member 430 due to a slope of the reflecting surface 440a serving as a reflecting surface.

For example, the concave reflecting member 440 may be made by a body having a concave shape at one surface faced with the lamps 410 and the flat reflecting member 430 and coating one surface of the body, i.e. a reflecting surface 440a with aluminum (Al) having good reflectivity. A material coated on the reflecting surface 440a is not limited to aluminum (Al), but silver (Ag) or nickel (Ni) having good reflectivity may be coated. Alternatively, the body of the concave reflecting member 440 may be made from gold (Au), silver (Ag), aluminum (Al) or nickel (Ni).

The lens module 450 collects light and heat secondarily from lights entering after reflecting from the flat reflecting member 430 and amplifies energy. The lens module 450 may comprise a single lens, or two or more lenses disposed in a vertical direction. Also, the lens module 450 may use at least one of a spherical lens, an aspherical lens and a microlens as a lens. If the lens module 450 comprises a plurality of lenses, it is possible to use various combinations of a spherical lens, an aspherical lens and a microlens. A configuration and a combination of the lens module 450 will be described in detail below.

The lens module 450 is inserted into the opening 440b provided in the concave reflecting member 440 with its upper portion being exposed toward an inside of the concave reflecting member 440 and its lower portion being exposed toward the chamber 100. Also, the lens module 450 is placed opposite the flat reflecting member 430, preferably directly below the flat reflecting member 430. As a result, lights reflected from the flat reflecting member 430 enter the lens module 450 placed opposite the flat reflecting member 430, and light and heat from the entering lights are collected by the lens module 450 and are irradiated on the substrate S. Consequently, lights passing through the lens module 450 are collected and energy is amplified. That is, the energy of lights passing through the lens module 450 is 15 times greater than not passing through the lens module 450. Therefore, even if a lamp, i.e. a tungsten halogen lamp is used as a heat source, as lights passing through the lens module 450 via the concave reflecting member 440 and the flat reflecting member 430 are collected and hence energy is amplified, the substrate S may be heated using energy greater than that of a conventional manner.

FIGS. 3 through 10 are cross-sectional views showing lens modules according to the first to the eighth embodiments of the present invention.

Figure 3:
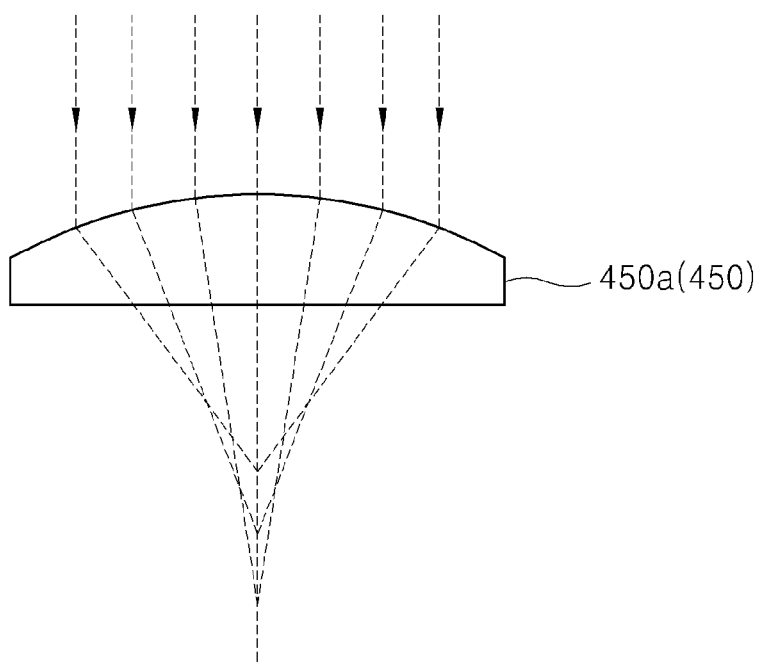
FIGS. 3 through 10 are cross-sectional views showing lens modules according to the first to the eighth embodiments of the present invention.
Figure 4:
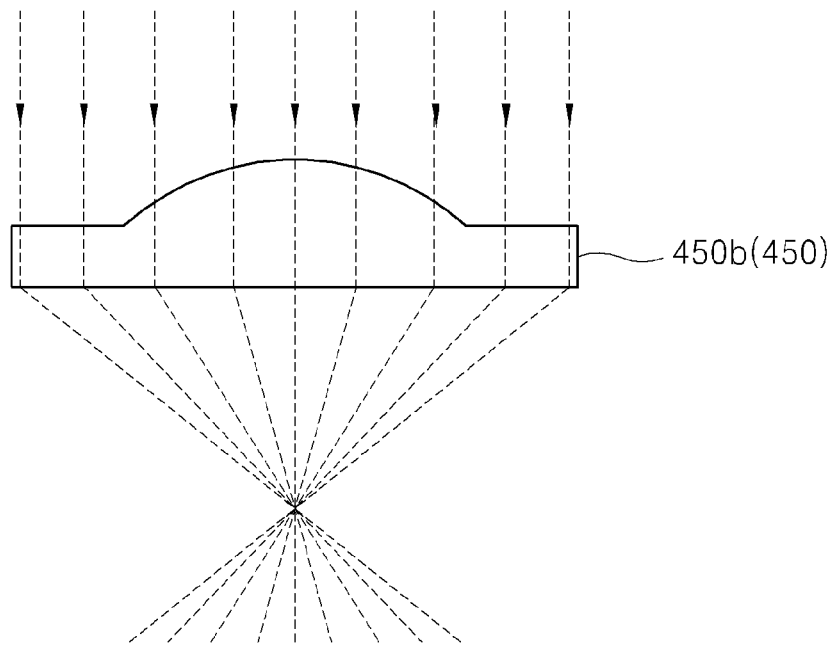

According to the first embodiment shown in FIG. 3, for example, the lens module 450 is concave at one side of a polygonal shape, i.e., in a direction that the flat reflecting member 430 is placed and comprises a single spherical lens 450a. Alternatively, as in the second embodiment shown in FIG. 4, the lens module 450 may comprise a single aspherical lens 450b that is concave at a center portion of one side faced with the flat reflecting member 430.

Figure 5:
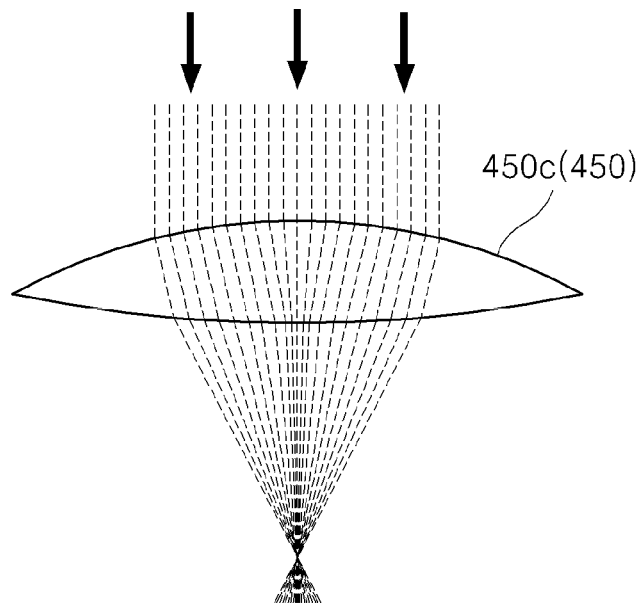
Figure 6:
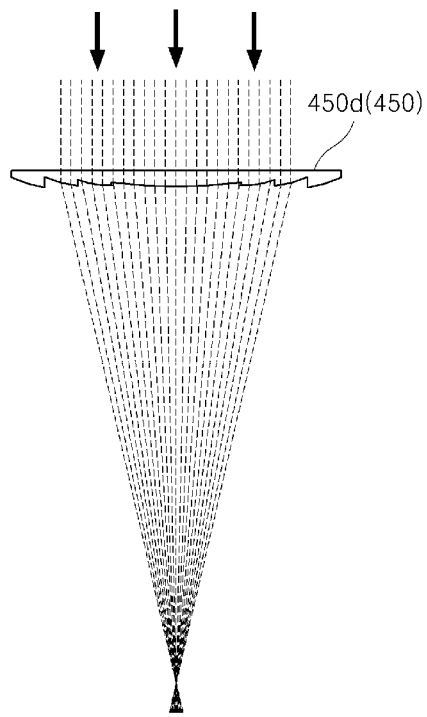

As another example, as shown in FIG. 5, a single oval-shaped spherical lens 450c that is concave at both sides, i.e. one side where the flat reflecting member 430 is placed and the other side where the chamber 100 is placed may be used, or as shown in FIG. 6, an aspherical lens 450d that has many concave surfaces in a direction that the chamber 100 is placed may be used.

Figure 7:
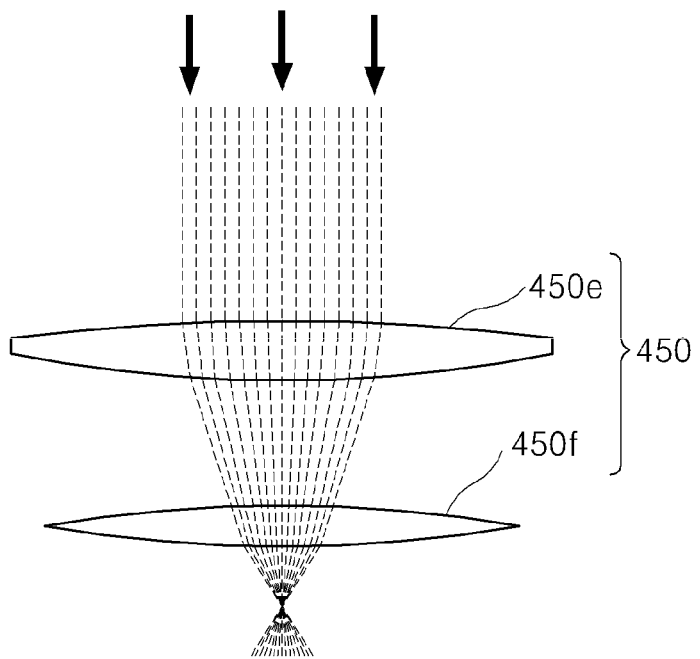
Figure 8:
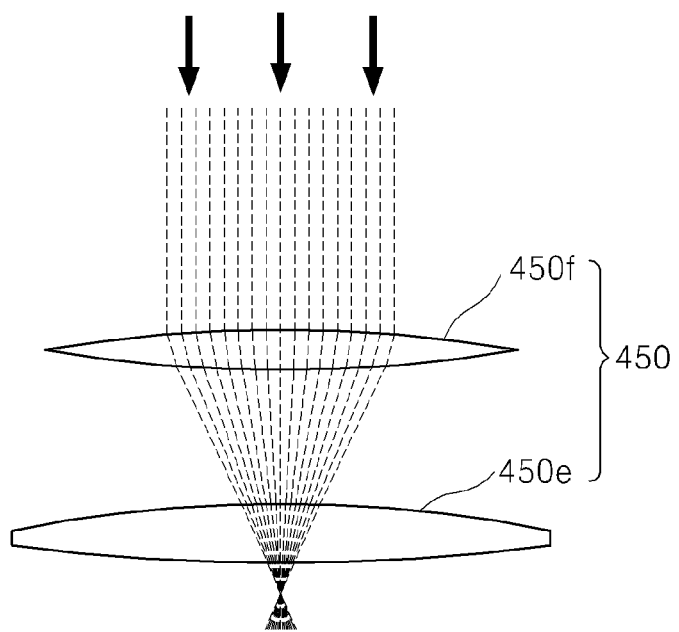
Figure 9:
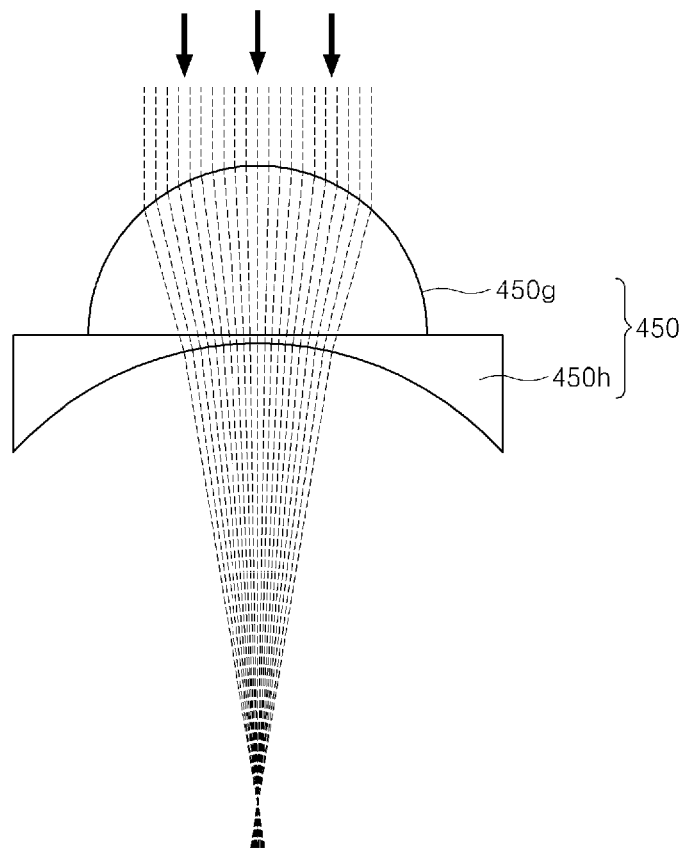

Also, a combination of a polygonal-shaped spherical lens 450e having concave surfaces at one side and the other side and an oval-shaped spherical lens 450f having concave surfaces at an upper side and the other side that is placed below the spherical lens 450e may be used, as shown in FIG. 7. To contrary, as shown in FIG. 8, the polygonal-shaped spherical lens 450e having concave surfaces at one side and the other side and the spherical lens 450e may be placed below the oval-shaped spherical lens 450f having concave surfaces at an upper side and the other side.

As another example, as in the seventh embodiment shown in FIG. 5, a combination of a semispherical-shaped spherical lens 450g and a concave lens 450h placed below the spherical lens 450g may be used.

Figure 10:
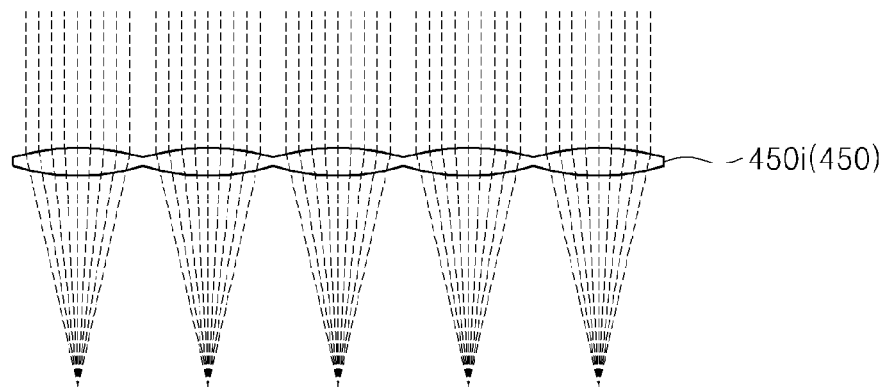

Also, as shown in FIG. 10, a microlens having many spherical surfaces at upper and lower portions in which a plurality of spherical lenses is arranged in one direction may be used.

Such a lens is not limited to a lens and a combination of lenses as described above, but various lenses and combinations of lenses may be used.

Figure 11:
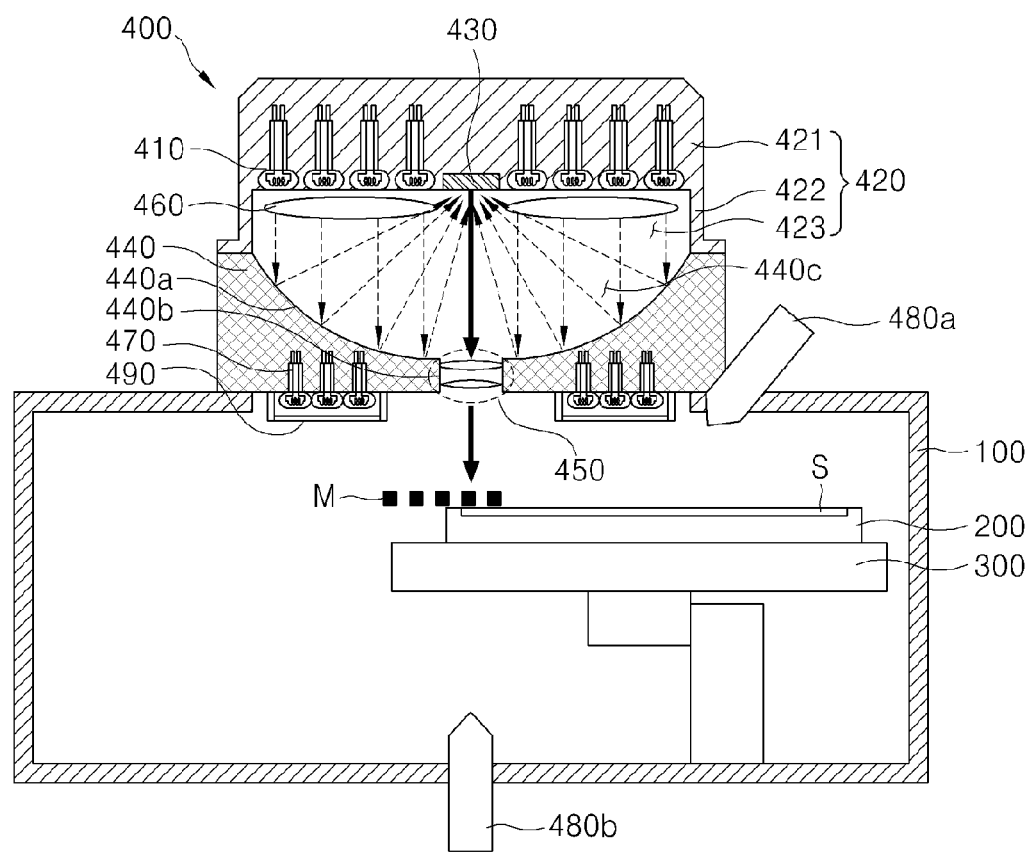
FIG. 11 is a cross-sectional view showing a heat treatment apparatus according to a modified embodiment of the present invention.

FIG. 11 is a cross-sectional view showing a heat treatment apparatus according to a modified embodiment of the present invention.

Referring to FIG. 11, a heat treatment apparatus according to a modified embodiment is almost similar to the heat treatment apparatus according to an embodiment shown in FIG. 1. The heat treatment apparatus according to a modified embodiment further comprises a plurality of auxiliary lamps 470 and a window 490 fixed to cover the auxiliary lamps 470. It also may comprise additionally a temperature detector 480b placed at a lower portion of the chamber 100, in addition to the temperature detector 480a placed at an upper portion of the chamber 100. Hereinafter, for convenience, the temperature detector 480a placed at an upper portion of the chamber 100 is designated as a first temperature detector 480a, and the temperature detector 480b placed at a lower portion of the chamber 100 is designated as a second temperature detector 480b.

The auxiliary lamp 470 serves to heat an inside of the chamber 100, i.e. an area around the substrate S on which light enters to reduce a temperature difference between the substrate S and a peripheral area. In other words, light emitted from the heater block 400 enters the substrate S inside the chamber 100 to heat the substrate S. In this case, since a temperature difference between the substrate S and the peripheral area of the substrate S is large, the substrate S may be broken due to such a temperature difference. Therefore, by heating the peripheral area of the substrate S inside the chamber 100 using the auxiliary lamp 410, such a temperature difference may be reduced.

The auxiliary lamp 470 is inserted and fixed into a lower portion of the concave reflecting member 440 with a surface from which light is emitted being protruded to a bottom of the concave reflecting member 440. That is, a portion of the auxiliary lamp 410 is protruded to a bottom of the concave reflecting member 440 and placed in a space inside the chamber 100. Also, the plurality of auxiliary lamps 470 is preferably disposed at both sides around the lens module 450 fixed in the concave reflecting member 440. That is, the plurality of auxiliary lamps 470 is fixed in left and right sides around the lens module 450. The auxiliary lamp 470 may use any one of a tungsten halogen lamp emitting infrared radiation and an arc lamp. Also, the auxiliary lamp 470 may be any one of a bulb type lamp and a liner type lamp.

The window 490 is fixed at the lower portion of the concave reflecting member 440 to cover the auxiliary lamps 470 protruded to the bottom of the concave reflecting member 440. According to an embodiment, the window 490 is made using quartz. However, a material for window is not limited to this, various materials that can transmit light may be used.

Hereinafter, referring to FIGS. 1 through 10, a process of heating rapidly a substrate using the heat treatment apparatus according to an embodiment of the present invention will be described.

Firstly, the substrate S is provided. The substrate S is situated on a susceptor fixed inside the chamber 100. The substrate S may be a wafer, a glass, a plastic film and the like, and may be a substrate applied to any one of FPD, LED, OLED, LCD, a solar cell and a flexible display.

After the substrate S is situated on the susceptor 200, the heater block 400 operates to heat the substrate S in a rapid thermal manner. That is, if the plurality of lamps 410 is operated, lights, for example infrared radiations are emitted from the plurality of lamps 410. These lights are diagonally moved in a downward direction, as shown in FIG. 2. Then, these lights pass through the auxiliary lens 460, and lights passing through the auxiliary lens 460 are vertically moved toward the concave reflecting member 440 in a straight downward direction. Then, these lights are reflected by the reflecting surface 440*a* of the concave reflecting member 440 and enter the flat reflecting member 430 placed between the plurality of lamps 410. Lights emitted from the plurality of lamps 410 are moved in a straight downward direction and are irradiated over the reflecting surface. An advancing direction of lights after reflecting from the reflecting surface 440*a* is altered toward the flat reflecting member 430. That is, a plurality of lights emitted from the plurality of lamps 410 is reflected from the reflecting surface of the concave reflecting member 440 and is collected to the flat reflecting member 430.

Then, lights are reflected from the flat reflecting member 430 and enter the lens module 450 placed opposite below the flat reflecting member 430. Then, light and heat are collected from the plurality of lights by the lens module 450 and enter an inside of the chamber 100. The collected light and heat are irradiated on the substrate S through an aperture of the mask M. As a result, light is irradiated only at a region corresponding to the aperture of the mask M. Consequently, a local region of the substrate S is heated. For example, a heating temperature may be about 1200° C.

While heating the substrate S by light emitted from the heater block 400, a stage moves horizontally the susceptor on which the substrate is situated in a horizontal direction, i.e. x or y direction. The whole substrate may be uniformly heated. Also, the stage may be moved up and down in a z-axis direction before, during or after a process.

As such, according to the foregoing embodiment, since lights are irradiated on the substrate S via the concave reflecting member 440, the flat reflecting member 430 and the lens module 450, light and heat may easily be collected from a plurality of lights. As a result, the energy of light for heating the substrate S is amplified. Therefore, even if a conventional lamp, i.e. a tungsten halogen lamp is used as a heat source, as lights passing through the lens module 450 via the concave reflecting member 440 and the flat reflecting member 430 are collected and hence energy is amplified, the substrate S may be heated using energy greater than that of a conventional manner. Also, the instant heating temperature and temperature increasing rate of the substrate may be enhanced, and a heat-focusing area may be increased. Consequently, it has an advantage that the productivity of semiconductor or display device manufacture that requires a rapid thermal process is improved.

DESCRIPTION OF REFERENCE NUMBERS

100: chamber 200: susceptor
400: heater block 410: lamp
420: housing 430: flat reflecting member
440: concave reflecting member 460: auxiliary lens

The invention claimed is:

1. A heater block comprising a light-emitting lamp; a concave reflecting member that is placed opposite the lamp and has a concave reflecting surface at one surface faced with the lamp; a lens module that is inserted into the concave reflecting member and has at least one lens; and a flat reflecting member that is placed opposite the lens module wherein an auxiliary lens is fixed between the lamp and the concave reflecting member, and the auxiliary lens is a spherical lens that is concave upwardly and downwardly.

2. The heater block of claim 1 wherein the lamp is provided as a plurality of lamps.

3. The heater block of claim 1 wherein the lamp is at least one of a tungsten halogen lamp and an arc lamp.

4. The heater block of claim 1 wherein the lamp is any one of a bulb type lamp and a liner type lamp.

5. The heater block of claim 1 further comprising a housing that is placed opposite the reflecting surface of the concave reflecting member and is coupled to the concave reflecting member at its one end, wherein the lamp and the flat reflecting member are inserted and fixed inside the housing.

6. The heater block of claim 5 wherein the light-emitting lamp is inserted and fixed with a surface where light is emitted from the lamp being exposed toward the concave reflecting member, and the flat reflecting member is inserted and fixed with a bottom surface of the flat reflecting member is exposed toward the concave reflecting member.

7. The heater block of claim 1 wherein the reflecting surface of the concave reflecting member is inclined downwardly from both edges toward a direction that the lens module is placed.

8. The heater block of claim 1 wherein at least the reflection surface of the concave reflecting member is made from at least one of aluminum (Al), silver (Ag), nickel (Ni) and gold (Au).

9. The heater block of claim 2 wherein the lamp is placed at both sides around the flat reflecting member.

10. The heater block of claim 1 wherein the flat reflecting member is made from at least one of gold (Au), aluminum (Al), silver (Ag) and nickel (Ni).

11. The heater block of claim 1 wherein the lens module comprises a plurality of lenses and the plurality of lenses is disposed in a vertical direction.

12. The heater block of claim 1 wherein the lens is at least one of a spherical lens, an aspherical lens, a microlens and concave lens.

13. The heater block of claim 1 further comprising an auxiliary lamp that is fixed such that its one end is inserted into one side of the concave reflecting member and the other end is protruded beyond the other side of the concave reflecting member, to heat a peripheral temperature around an object to be heat-treated.

14. The heater block of claim 13 further comprising a window that covers the auxiliary lamp.

15. A heat treatment apparatus comprising a chamber having an inner space; a susceptor that is fixed inside the chamber to support a substrate; and a heater block that is placed opposite the susceptor to heat the substrate, wherein the heater block comprises a light-emitting lamp; a concave reflecting member that is placed opposite the lamp and has a concave reflecting surface at one surface faced with the lamp; a lens module that is inserted into the concave reflecting member and has at least one lens; and a flat reflecting member that is placed opposite the lens module.

16. The heat treatment apparatus of claim 15 wherein the heater block is placed at an outside of the chamber or at an inside of the chamber.

17. The heat treatment apparatus of claim 15 wherein the reflecting surface of the concave reflecting member is inclined downwardly from edges toward a direction that the lens module is placed.

18. The heater block of claim 15 wherein the lens module comprises a plurality of lenses, the plurality of lenses is disposed in a vertical direction, and the lenses are at least one of a spherical lens, an aspherical lens, a microlens and concave lens.

* * * * *